Figure 1:
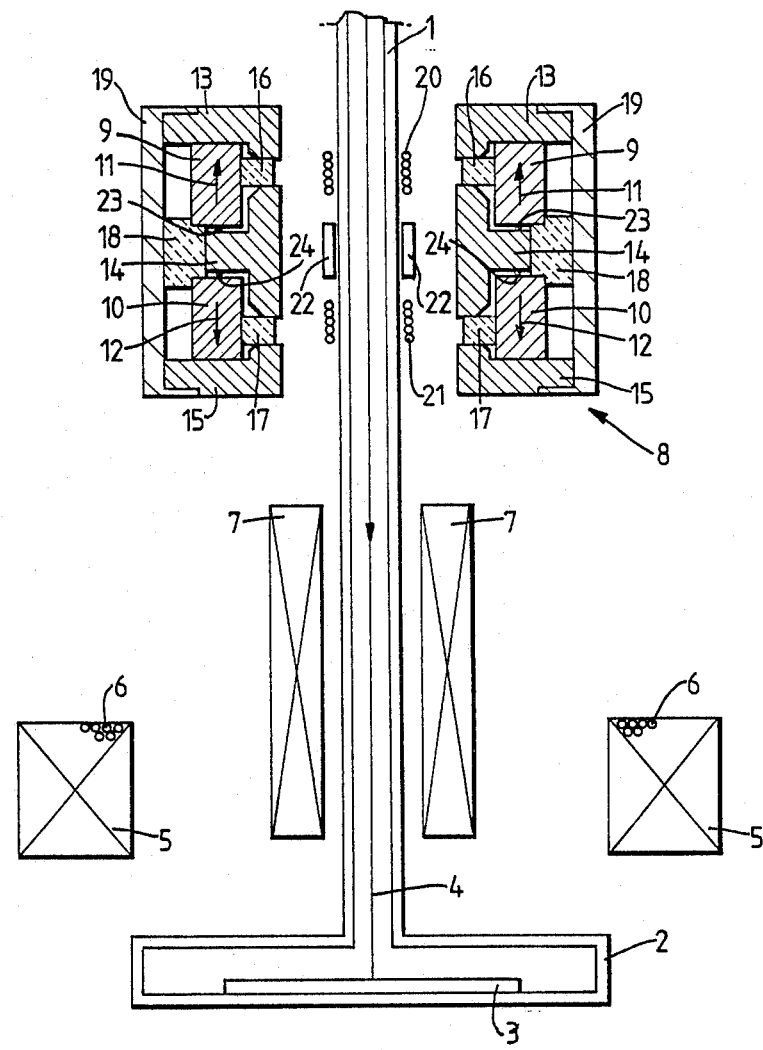

United States Patent [19]

Chisholm

[11] Patent Number: 4,806,766

[45] Date of Patent: Feb. 21, 1989

[54] MAGNETIC LENS SYSTEM

[75] Inventor: Thomas Chisholm, Best, Netherlands

[73] Assignee: U.S. Philips Corporation, New York, N.Y.

[21] Appl. No.: 65,536

[22] Filed: Jun. 23, 1987

[30] Foreign Application Priority Data

Jun. 25, 1986 [GB] United Kingdom ............... 8615466

[51] Int. Cl.⁴ .............................................. H01J 37/10
[52] U.S. Cl. ............................ 250/396 ML; 250/310; 250/311
[58] Field of Search ............... 250/396 ML, 310, 311, 250/396 R

[56] References Cited

U.S. PATENT DOCUMENTS 3,560,739  2/1971  Wolff .................................. 250/311
3,812,365  5/1974  LePoole ...................... 250/396 ML
4,701,620 10/1987  Okumura et al. ........... 250/396 ML Primary Examiner—Carolyn E. Fields
Assistant Examiner—John A. Miller

[57] ABSTRACT

A magnetic lens system is provided for a beam of charged particles, comprising a pair of ring-shaped permanent magnets through which the beam passes, the axes of the rings lying coaxially along the beam direction, and the two rings being axially separated and axially oppositely magnetised. A pair of separated conducting focus coils are provided one for each ring, the axes of the focus coils lying coaxially along the beam direction, each focus coil lying within its associated ring, and the focus coils being connected in series opposition to carry an adjustable direct electric current for fine focusing of the beam by the lens without rotation of the focused beam. The lens may provide the fast fine focus adjustment needed to compensate for space charge defocussing produced by changes in beam current.

8 Claims, 1 Drawing Sheet

MAGNETIC LENS SYSTEM

DESCRIPTION

This invention relates to a magnetic lens system for a beam of charged particles, comprising a pair of axially separated ring shaped permanent magnets through which the beam passes, the axes of the rings lying coaxially along the beam direction, and the two rings being axially and oppositely magnetised.

Such a lens is known from U.S. Pat. No. 3,812,365 wherein the lens is used as a rotation-free field lens in an electron microscope. The expression "rotation-free" refers to the fact that the lens changes the convergence of an electron beam but does not at the same time produce any rotation in the electron image as finally focussed. The rotation effect of a magnetic lens is known to be proportional to the integral of the magnetic flux density taken along the lens axis right through the lens. This integral can be made equal to zero by arranging for the axial flux to consist of two parts of equal extent and strength which follow one another along the axis but which are of opposite directions. The rotation of the lens is then zero as provided in the above cited patent specification. The focussing power of such a lens is, however, proportional to the integral of the square of the magnetic flux along the axis so that the reversal of magnetic field does not affect the focussing power of the lens.

An important application of magnetic lens systems is in electron beam pattern generators generally and especially those which use an electron beam focused to a spot of a specified shape, size, and orientation to write a pattern in an electron sensitive resist on a substrate. The electron optics of such generators are arranged to produce a constant current density in the spot to ensure that a predetermined resist exposure is obtained in a predetermined dwell time of the spot at a location during the course of stepwise spot movement. To realise the full potential of the shaped spot when used with the vector scan method of writing, the spot size must be capable of being rapidly changed, typically in 100 ns. With constant current density, these changes necessarily produce proportionate total beam current changes. It is well known that interactions between electrons result in blurring of the edges of the spot by an amount which depends on the total current in the beam. Thus, changes in beam current produce changes in edge definition in the spot. Some of this variance in edge definition can be corrected by refocusing which must, however, be achieved in the same time as the change in spot size. But, the refocusing must not rotate the focused shaped spot. Otherwise pattern definition would be lost as there would be spot overlapping and overexposure in some areas and gaps between spots with consequent under exposure in other areas.

Since the focusing effect is determined by the square of the magnetic flux, a larger change in focusing effect due to a given change in flux can be obtained by superimposing the given change on a much larger fixed field. It is known to put a small, fine focus lens in the centre of a final objective lens just before the substrate. But such a combination is not rotation free and the inductance of the coil of the fine focus lens is large owing to the presence of the objective lens magnetic circuit.

It is an object of the invention to provide a fine focus lens for a beam of charged particles that is rotation-free and is also of low inductance to allow fast focus change.

The invention provides a mangetic lens system for a beam of charged particles, comprising a pair of ring-shaped permanent magnets through which the beam passes, the axes of the rings lying coaxially along the beam direction, and the two rings being axially separated and axially oppositely magnetised, characterised in that a pair of separated conducting focus coils are provided one for each ring, the axes of the focus coils lying coaxially along the beam direction, each focus coil lying within its associated ring, and the focus coils being connected in series opposition to carry an adjustable direct electric current for fine focusing of the beam by the lens without rotation of the focused beam. Thus, both the axial field due to the two permanent magnets and due to the two coils has a reversal of field along the axis and hence both can be separately rotation free. The field due to the coils is superposed on a potentially much larger field due to the permanent magnets and so the focusing changes due to a given current change in the coils are much enhanced, as noted above. Also, there is no closed path of magnetic material passing through the coils so that their inductance can be low.

The magnetic lens system may be characterised in that the permanent magnets are each surrounded by pole pieces which concentrate the magnetic field along the axis and which, towards the axis, are composed of a soft ferrite material, and in that each focus coil is of substantially smaller diameter than its associated ring. With this arrangement the magnetic circuit of the pole pieces does not materially increase the inductance of the coils, which are laregly free of magnetic material. The coils are hence of low inductance which is required to achieve short focus change times. The use of high electrical resistance soft ferrite for the pole pieces minimises residual eddy current effects caused when the current in the coils is changed, contributing to rapid establishment of the new field after the current change.

The magnetic lens system may also be characterised in that on the side remote from the axis, the pole pieces are contained within a ferro-magnetic shell. In addition to providing a return path for stray magnetic flux the ferro-magnetic shell also shields the lens assembly from external magnetic fields which might otherwise disturb the focus of the beam. Also, the pole pieces of each magnet may be separated by non-magnetic and non-conducting spacers on the side toward the axis. Eddy currents due to current changes in the coils are thereby avoided while the mechanical rigidity of the pole pieces is assured. The spacers may be of ceramic or glass.

Such a magnetic lens system may be characterised in that, on the side remote from the axis, gaps are provided between the pole pieces and the magnets, the widths and areas of the gaps being chosen to define the magnetic flux on axis. The reluctance of the gaps can be so chosen in relation to the magnet strengths to provide a desired axial flux.

The magnetic lens system in accordance with the invention may not be suitable for use as the final objective lens near the substrate and consequently it may precede the final objective lens. In this event there is the possibility of mechanical misalignment of the focus adjustment lens with respect to the beam. This can introduce beam tilt and a consequent shift in focused spot position. Thus additional alignment or deflection correction may be required. The lens system may be further characterised in that a beam alignment coil assembly is provided at the location of the pair of focus coils. Alignment correction currents may be fed through the coils of this assembly, to correct the beam alignment.

An embodiment of the invention will now be described, by way of example, with reference to the accompanying drawing, in which, FIG. 1 shows the lower end of the evacuated column of an electron beam pattern generator showing the final objective lens and substrate schematically preceded by the space charge correction lens.

Referring to FIG. 1, an axial section of the lower end of a tubular evacuated column 1 is shown sealed to a substrate holder chamber 2. The substrate 3, having an electron sensitive resist on its upper surface, is shown within the chamber and is normally mounted on a table, not shown, which is capable of moving the substrate in two dimensions in its own plane to bring any selected area of the substrate under the electron beam 4. All the magnetic lens components are also shown in axial section. The final objective lens 5 is shown as a section through its coils, the associated pole pieces not being shown. The coil windings are shown at 6 where they are normal to the plane of the drawing. Lens 5 focuses the beam 4 to a shaped spot on the substrate by forming a real image of a correspondingly shaped aperture, not shown, further up the column which is illuminated by a wider beam of electrons from a source not shown. This aperture can be changed in size and shape by means which are not described here as this is not relevant to the present invention.

The electron beam is deflected over the substrate by a deflection coil assembly 7 shown in section. This assembly will normally comprise a main deflection coil and a high speed deflection coil.

A focus correction lens 8 is provided, preceding the final objective lens 5. In the particular configuration of pattern generator being described, the focus correction lens produces a small change in beam convergence which is added to the major focusing effect of lens 5. Lens 8 does not produce a real image of a shaped aperture further back up the column at a point between lens 5 and lens 8. However, in other configurations, the focus correction lens may produce a real image, either the final image on the substrate or an intermediate image in the column.

Lens 8 comprises a pair of ring-shaped permanent magnets 9 and 10 through which the beam 4 passes. The rings are shown in axial section, the axes of the rings lying coaxially along the beam direction and coinciding with the axis of the tubular column 1. The two rings are axially separated by pole piece and separator components to be described. The two rings are axially oppositely magnetised as shown by the arrows 11, 12. The rings are of magnetised ferrite, for example Ferroxdure FDX270 (Trade Mark). Separate annular pole pieces are provided for each magnet by ring shaped pole pieces 13, 14, 15, towards the axis, constructed of soft ferrite material to avoid eddy current effects. Spacer rings 16, 17 are provided to separate the pole pieces and are constructed of ceramic or glass. Since these rings are non-magnetic and non-conducting eddy current effects are avoided. Also the spacing of the pole pieces is well defined. A non-magnetic ring 18, of ceramic or glass, largely isolates pole piece 14 from a cylindrical ferromagnetic shell 19 which contains the lens assembly 8. The gaps 23 and 24 between pole piece 14 and magnets 9 and 10 control the return path for the magnetic flux away from the axis. This return path is of a reluctance defined by the gap width and the outside diameter of pole piece 14 and hence controls the value of magnetic flux produced on the axis by the permanent magnets. The shell 19 shields the lens from externally generated magnetic flux and also acts as a return path for residual magnetic flux from the magnets 9 and 10.

The two magnetised rings 9, 10 are equal in dimensions and equally but oppositely magnetised. Hence it is assured that the integral of magnetic flux along the lens axis, i.e. along the beam, is zero giving zero image rotation. But combinations of unequally sized and unequally magnetised magnets can also give a zero integral.

A pair or separated conducting focus coils 20, 21 are provided, one for each magnet and lying within its associated magnet. The coils are wound around the tubular column so that their axes lie along the beam. In use, the two coils are connected in series opposition to carry an adjustable direct current. The opposed magnetic fields generated by the two coils also generate a rotation-free lens effect regardless of the magnitude or sign of the direct current. The field of the coils supplements that of the permanent magnets. However, since the focusing effect is proportional to the square of the total flux, the change in focusing effect generated by a given change in coil flux is proportionately greater when added to a standing flux.

It should be noted that there is no magnetic material threading the coils. Hence they are substantially air cored and their inductance is low, assisting fast current switching.

In a practical case the correction of the anticipated space-charge defocusing due to the expected range of beam currents can be achieved with a maximum of about 6 ampere-turns in each coil. Current switching can be achieved in about 100 ns. The permanent magnets produce a flux-density on axis of 28.2 mTa in each gap, giving a focal length of 109 mm. A 10 ampere-turn change in each coil changes the flux-density by 0.9 mTa and the focal length by about 5.5 mm. The axial length of the lens is 40 mm, the outside diameter 70 mm and the bore 25 mm. With these dimensions the spherical aberration of the combination is only marginally worse than that of the permanent magnet lens alone.

Since the focus correction lens 8 is separate from the objective lens 5 there is the possibility of misalignment of lens 5 with respect to the beam. This could introduce beam tilt and a consequent shift in focused spot position. Lens 8 provides a good site for a beam alignment coil assembly 22. This comprises a set of beam deflector coils through which suitable d.c. currents can be passed to produce beam alignment at the deflection assembly 7.

Finally, the lens 8 also provides a convenient site for a pair of stigmator quadrupole coil assemblies through which suitable d.c. currents are passed to correct astigmatism in the beam. The stigmator coil assembly is conventional and is not shown in FIG. 1 for clarity.

The invention has been described in relation to its use in an electron beam pattern genertor. It may also be used in other electron beam instruments, such as transmission on scanning electron microscopes. The beam of charged particles may alternatively comprise ionised atoms or molecules or may be a beam of fundamental charged particles.

I claim:

1. A magnetic lens system for a beam of charged particles, comprising a focus correction lens including a pair of ring-shaped permanent magnets through which the beam passes, the axes of the rings lying coaxially along the beam direction, and the two rings being axially separated and axially oppositely magnetised, characterised in that a pair of separated conducting focus coils are provided, one for each ring, the axes of the focus coils lying coaxially along the beam direction, each focus coil lying within its associated ring, and the focus coils being connected in series opposition, said plus coils comprising means for carrying an adjustable direct electric current for fine focusing of the beam by the lens without rotation of the focused beam.

2. A magnetic lens system base claimed in claim 1 characterised in that the permanent magnets are each surrounded by pole pieces which concentrate the magnetic field along the axis and which, towards the axis, are composed of a soft ferrite material, and in that each focus coil is of substantially smaller diameter than its associated ring.

3. A magnetic lens system as claimed in claim 2 characterised in that, on the side remote from the axis, the pole pieces are contained within a ferro-magnetic shell.

4. A magnetic lens system as claimed in claim 3, characterised in that the pole pieces of each magnet are separated by non-magnetic and non-conducting spacers on the side towards the axis.

5. A magnetic lens system as claimed in claim 4, characterised in that, on the side remote from the axis, gaps are provided between the pole pieces and the magnets, the widths and areas of the gaps being chosen to define the magnetic flux on axis.

6. A magnetic lens system as claimed in claim 5 characterised in that a beam alignment coil assembly is provided at the location of the pair of focus coils.

7. A magnetic lens system as claimed in claim 6 characterised in that the two focus coils are of substantially equal dimensions and have an equal number of turns, and in that the permanent magnets are of substantially equal dimensions and are equally magnetised.

8. A magnetic lens system as claimed in claim 7 characterised in that a stigmator coil assembly is provided at the location of the pair of focus coils.

* * * * *